United States Patent [19]
Mae et al.

[11] Patent Number: 6,098,868
[45] Date of Patent: Aug. 8, 2000

[54] BUMP FORMING METHOD AND BUMP BONDER

[75] Inventors: Takaharu Mae; Kiyoshi Mayahara; Shoriki Narita, all of Hirakata; Masaya Watanabe, Osaka; Yuichi Takakura, Hirakata; Masahiko Ikeya, Neyagawa, all of Japan

[73] Assignee: Masushita Electric Industrial Co., Ltd., Osaka, Japan

[21] Appl. No.: 09/423,375

[22] PCT Filed: May 12, 1998

[86] PCT No.: PCT/JP98/02253

§ 371 Date: Nov. 4, 1999

§ 102(e) Date: Nov. 4, 1999

[87] PCT Pub. No.: WO98/53485

PCT Pub. Date: Nov. 26, 1998

[30] Foreign Application Priority Data

May 23, 1997 [JP] Japan ..................................... 9-133917

[51] Int. Cl.[7] .......................... B23K 31/02; H01L 21/44; H01L 23/48; H01L 23/52; H01L 29/41

[52] U.S. Cl. ................. 228/102; 228/180.22; 228/180.5; 228/244; 228/4.5; 228/14; 228/41; 438/613; 257/737; 257/784

[58] Field of Search .............................. 228/110.1, 173.5, 228/180.22, 180.5, 204, 213, 244, 4.5, 14, 41, 904; 438/612, 613, 617; 257/737, 738, 784

[56] References Cited

U.S. PATENT DOCUMENTS 4,925,083  5/1990  Farassat et al. .
5,124,277  6/1992  Tsumura ........................................ 437/9
5,207,786  5/1993  Kawashimo .
5,297,722  3/1994  Takahashi et al. .
5,326,015  7/1994  Weaver et al. .......................... 228/102
5,514,334  5/1996  Ogashiwa .................................. 420/571
5,891,796  4/1999  Nakamura et al. ....................... 438/617
5,897,049  4/1999  Nakamura et al. .................... 228/180.5
5,953,624  9/1999  Bando et al. ............................ 438/617
5,981,371  11/1999 Yamazaki et al. ....................... 438/617

FOREIGN PATENT DOCUMENTS 8-249724  9/1996  Japan .
9-219403  8/1997  Japan .

*Primary Examiner*—Patrick Ryan
*Assistant Examiner*—Colleen Cooke
*Attorney, Agent, or Firm*—Jordan and Hamburg LLP

[57] ABSTRACT

A bump forming method comprising a first step of forming a ball (5) at a distal end of a wire (4) which protrudes from a lower end of a capillary (12); a second step of opening a damper (11) which securely holds the wire (4) above the capillary (12) and bringing down the capillary (12) as well as the damper (11), in which an amount of movement of the damper (11) is smaller than that of the capillary (12) by such an amount as to be equivalent to a length of the wire (4) being protruded from the lower end of the capillary (12) in the first step; a third step of forming a bump (21) from the ball (5) by bonding; and a fourth step of separating the wire (4) from the bump (21) by closing the damper (11) and lifting up the damper (11) and the capillary (21) to an initial position of the first step as well as causing a distal end of the wire (4) to protrude from the lower end of the capillary (12) by a predetermined length, whereby a step of drawing out a leading end of the wire (4) from the capillary (12) is eliminated.

2 Claims, 6 Drawing Sheets

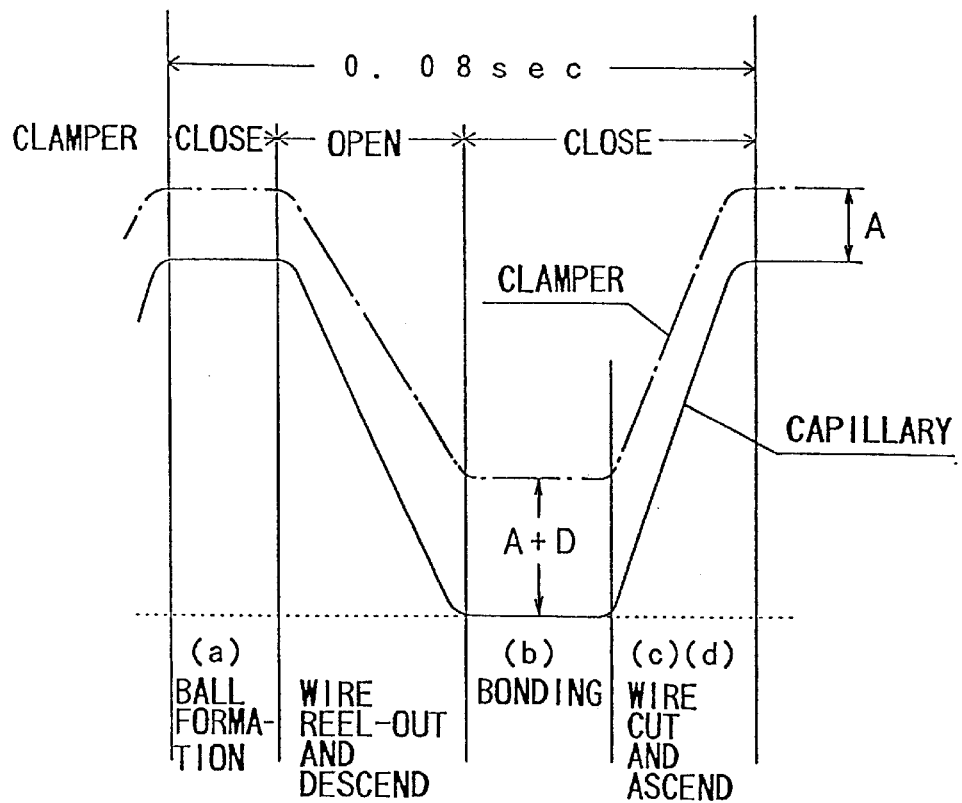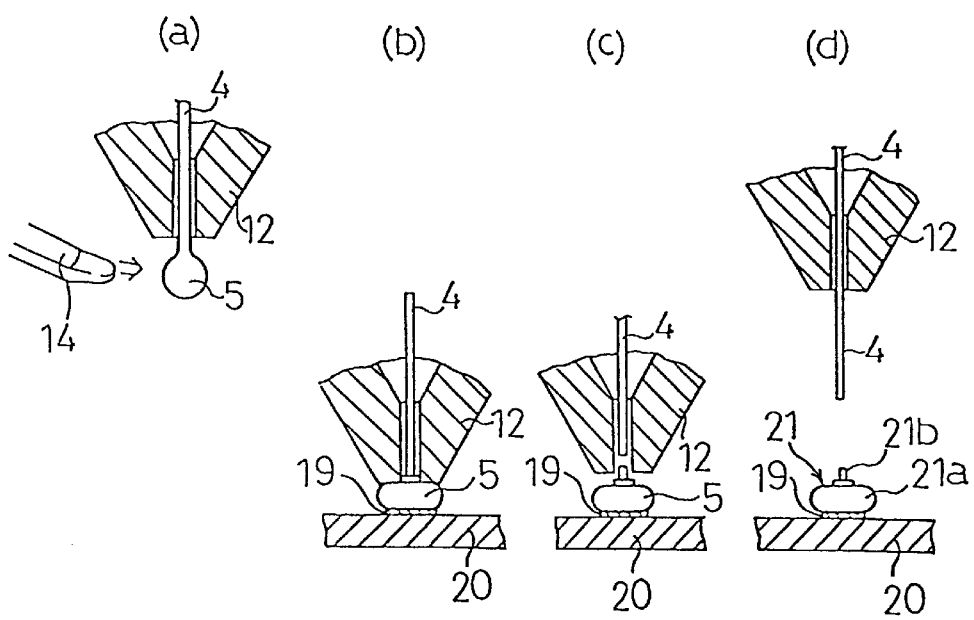
Fig. 3

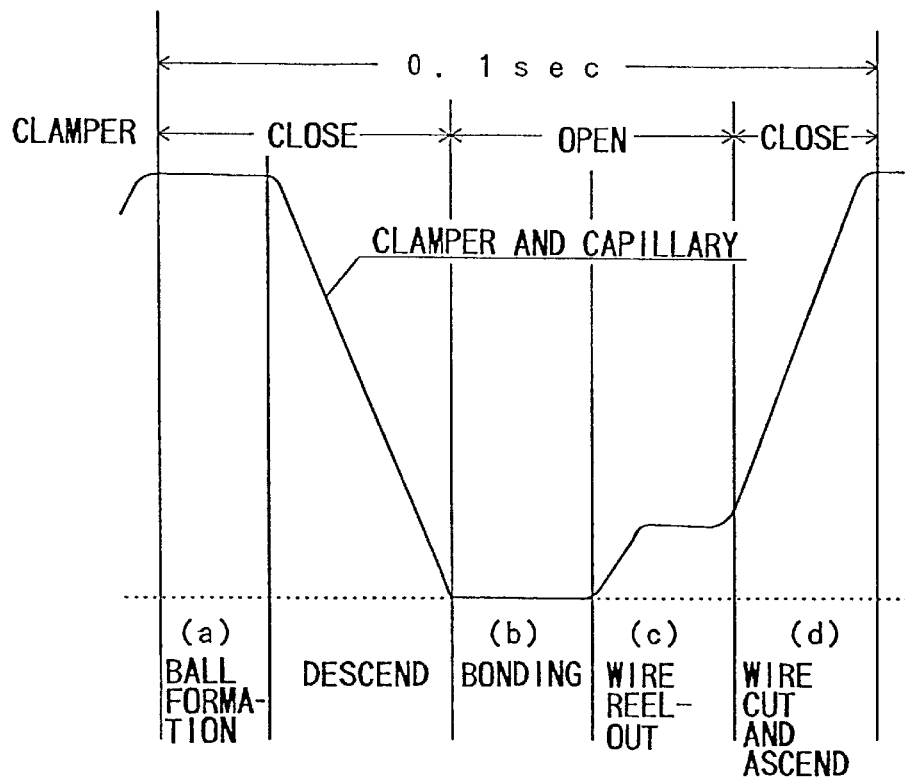
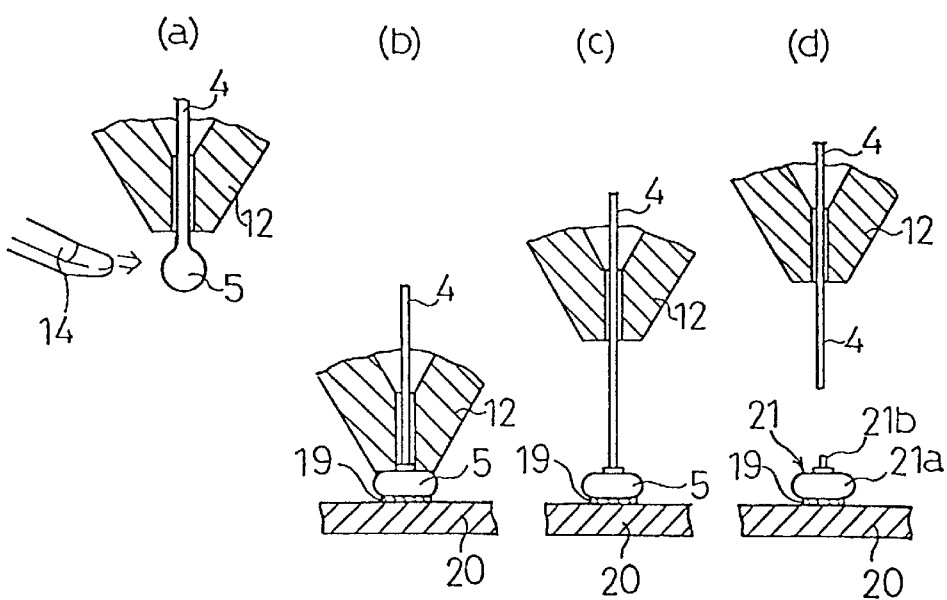
Fig. 6
Prior Art

BUMP FORMING METHOD AND BUMP BONDER

TECHNICAL FIELD

The present invention relates to a bump forming method and a bump bonder for forming a bump at an electrode portion of an IC chip for electric connection by wire bonding technology.

BACKGROUND ART

A variety of bonders are depicted in "Semiconductors handbook (Revised Edition)", Ohm Publishing, for electrically connecting an electrode of an IC chip and a conductor of its package by the wire bonding technology. The inventors of the present application have discovered that such a conventional bump bonder for wire bonding can be utilized for forming a bump on an electrode of an IC chip for electric connection, and have devised such a bump bonder as the one proposed in Japanese Patent Application No.8-249724. This bump bonder includes at its primary section or bonding station a bonding stage equipped with a heater for ultrasonic thermal compression bonding and a bonding head therebehind supported for movement in both X and Y directions.

As shown in FIG. 4, the bonding head 1 comprises a wire reel 3 mounted to a wire reel mount 2 and a bonding mechanism 10 for carrying out bonding operation with a wire 4, which is fed from the wire reel 3 located above, to a bonding object such as an IC chip or a wafer placed on the bonding stage (not shown). Also provided between the wire reel 3 and the bonding mechanism 10 are a first wire tensioner 7 for applying an upward blow of air 6 to a midway portion of the wire 4 to cause the wire 4 to be curved upwardly and a second wire tensioner 9 for exposing the wire 4 to an upward blow of air 8 just above a wire guide 11a of a damper 11 in the bonding mechanism 10 to tension the wire 4 upwardly. Accordingly, the wire 4 drawn from the wire reel 3 can constantly be fed into the bonding mechanism 10 while being floated under proper tension through a prescribed feeding path by the blows of air 6 and 8.

Referring to FIGS. 4 and 5, the bonding mechanism 10 comprises the damper 11 for securely holding the wire 4, a horn 13 provided with a capillary 12, through a distal end of which the wire 4 is passed, for applying ultrasonic vibration via the capillary 12 to a ball 5 (FIG. 6) developed from a leading end of the wire 4, and a torch 14 for forming the ball 5 with electric discharge. A monitor camera 15 is provided above for visually monitoring the bonding operation, which displays a monitoring image on a monitor display (not shown), and delivers a monitor signal to a data processor (not shown) where it is processed.

The damper 11 and the horn 13 are mounted to a swing member 16 for upward and downward swing movements about an unshown pivot. The swing member 16 is driven to swing by a vertical motion electromagnetic driver 17 for causing integral vertical movements of the damper 11 and the horn 13. Also, an open/close electromagnetic driver 18 is provided for opening and closing the damper 11.

The bonding operation of the above arrangement will now be explained referring to FIG. 6. While the damper 11 and the capillary 12 are located at their initial levels with the leading end of the wire 4 extending a given length from the lower end of the capillary 12, the torch 14 is activated to produce a spark current in synchronism with the movement of the bonding head 1 to a location where it comes opposite to a target electrode 19 on an IC chip 20 so that the leading end of the wire 4 is melted to form a ball 5 such as shown in FIG. 6(a). The opposite relationship between the wire 4 and the electrode 19 is monitored and controlled precisely with visual recognition by the monitor camera 15.

The swing member 16 is then driven by the vertical motion electromagnetic driver 17 for causing the damper 11 and the capillary 12 to descend towards the IC chip 20 placed on the bonding stage (not shown). When the capillary 12 presses down the ball 5 of the wire 4 against the electrode 19 on the IC chip 20, as shown in FIG. 6(b), the horn 13 applies ultrasonic vibration via the capillary 12 to the ball 5 which is thus bonded to the electrode 19 by thermal compression and ultrasonic vibration. It is preferable to set the compression force within the range of 30 to 50 g and the ultrasonic vibration, which is applied in a horizontal direction, to be 0.5 micrometer in amplitude and 60 to 70 kHz (specifically 63.5 kHz) in frequency.

During the bonding operation, the clamper 11 is opened by the open/close electromagnetic driver 18 and lifted up together with the capillary 12 to a prescribed level by the vertical motion electromagnetic driver 17. Accordingly, the wire 4 is extended from the lower end of the capillary 12 by a certain length as shown in FIG. 6(c).

The clamper 11 is then closed by the open/close electromagnetic driver 18 to hold the wire 4 securely, after which the swing member 16 is driven by the vertical motion electromagnetic driver 17 to cause the clamper 11 and the capillary 12 to move upwards as shown in FIG. 6(d) to their initial level shown in FIG. 6(a). In an early stage of this step, the wire 4 is separated at a boundary of heat effect hence leaving on the electrode 19 a bump 21 of about 60 micrometers high which consists of a ball portion 21a and a wire portion 21b of 30 to 40 micrometers high.

Since the above-described conventional bump forming method includes the step of drawing out the wire 4 shown in FIG. 6(c), which requires substantially 0.02 second, the cycle of bump forming operation from the start of action until it is returned to the initial state takes a total of about 0.1 second, because of which productivity cannot be further improved.

It is thus an object of the present invention to provide a bump forming method and a bump bonder with which the time required for the cycle of bump forming operation can be reduced to thereby improve the productivity.

DISCLOSURE OF INVENTION

A method of forming a bump according to the present invention comprises: a first step of forming a ball at a distal end of a wire which protrudes from a lower end of a capillary; a second step of opening a damper which securely holds the wire above the capillary and bringing down the capillary as well as the clamper, in which an amount of movement of the damper is smaller than that of the capillary by such an amount as to be equivalent to a length of the wire being protruded from the lower end of the capillary in the first step; a third step of forming a bump from the ball by bonding; and a fourth step of separating the wire from the bump by closing the damper and lifting up the damper and the capillary to an initial position of the first step as well as causing a distal end of the wire to protrude from the lower end of the capillary by a predetermined length.

As the capillary and the damper are lifted up and down separately, their lowermost locations in the second step are different from each other. This allows the wire to be separated from the finished bump as well as extended from the lower end of the capillary to provide another leading extension while the capillary and the clamper are being lifted up in the fourth step. Accordingly, a step of drawing out the wire which is necessary in the conventional method is eliminated and the cycle duration for forming a bump will successfully be decreased thus remarkably improving the productivity.

A bump bonder according to the present invention is provided with a capillary for bonding a ball developed from a leading end of a wire; a clamper for securely holding the wire above the capillary; a horn having the capillary at the distal end thereof; supporting means for supporting a horn such as to allow the horn to move upwards and downwards, a driver for driving upward and downward movements of the horn; supporting means for supporting the clamper independently of the horn for upward and downward movements; and a driver for driving the clamper to move upward and downward.

By this arrangement, since the means for lifting up and down the horn and the clamper are provided separately, the above described bump forming method can be implemented with the addition of a simple mechanism to the conventional construction.

BRIEF DESCRIPTION OF DRAWINGS

FIG. 3 is an explanatory view showing a series of bonding steps in the embodiment;

FIG. 6 is an explanatory view showing a series of bonding steps in the conventional bonding head.

BEST MODES FOR CARRYING OUT THE INVENTION

Figure 4:
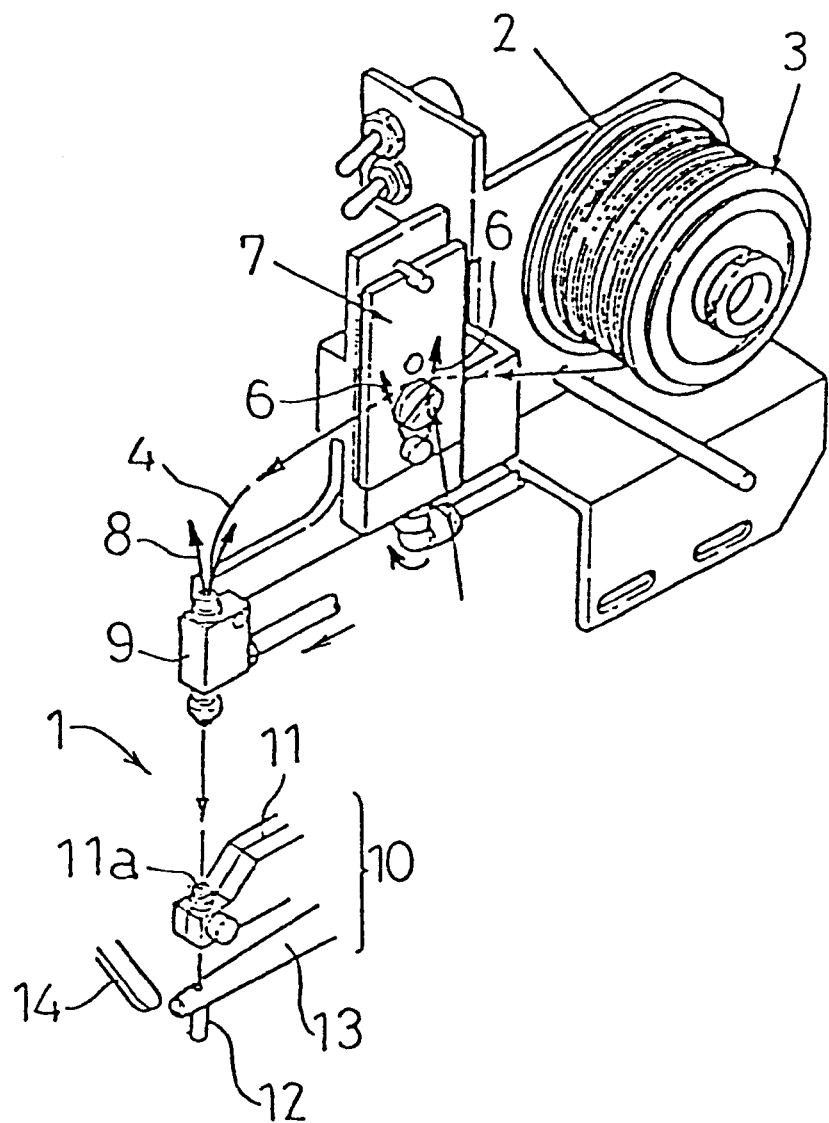
FIG. 4 is a perspective view of a wire feeder mechanism in a conventional bonding head.
Figure 5:
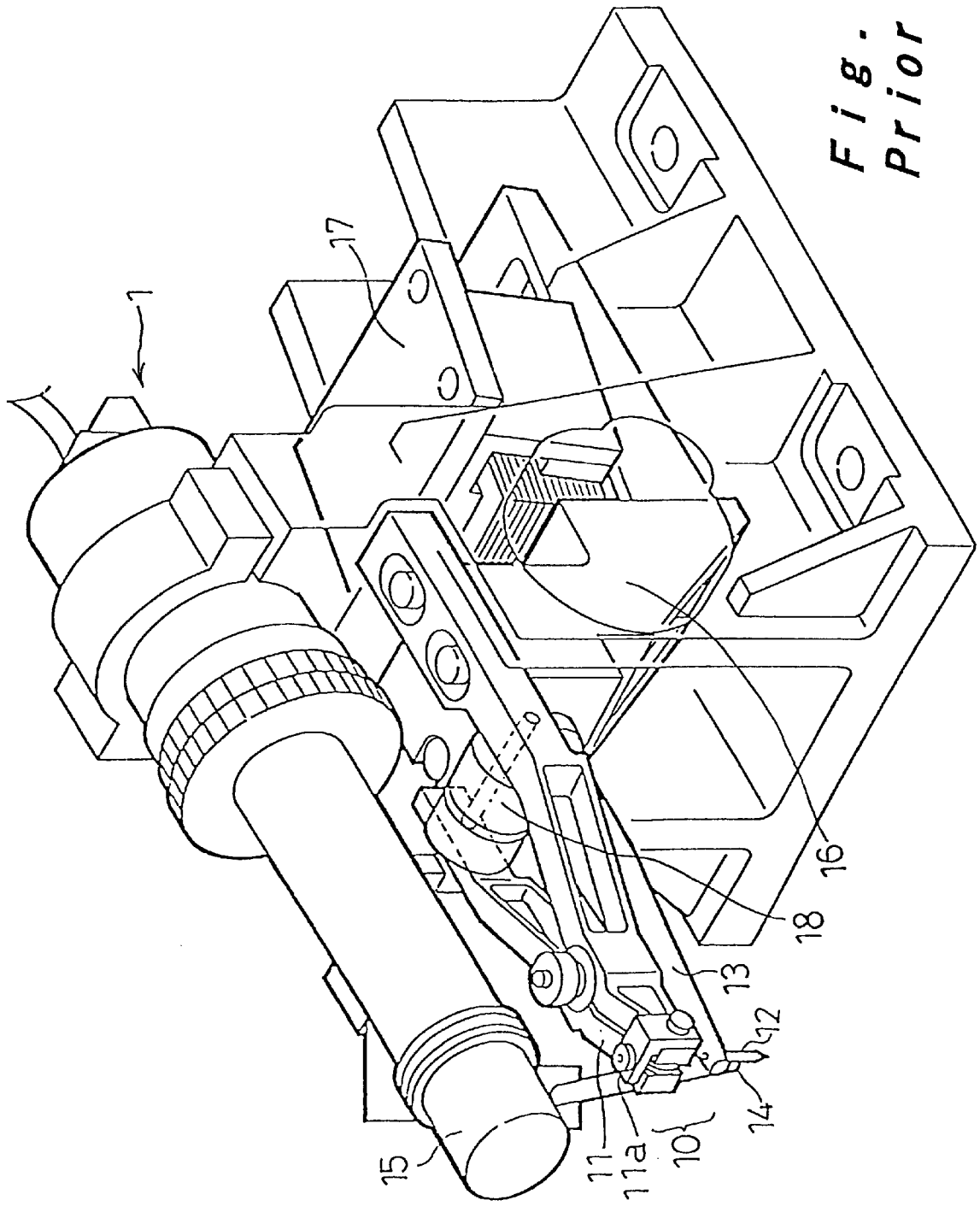
FIG. 5 is a perspective view of a primary arrangement of the conventional bonding head.

The bonding head in the bump bonder according to one embodiment of the present invention will be hereinafter described in more detail referring to FIGS. 1 to 3. Since a wire feeder mechanism of the bonding head is identical to the one shown in FIG. 4, its description is omitted while the other constructions will be explained. Also, like elements are denoted by the same numerals as those shown in FIG. 5 and will be explained in no more detail.

Figure 1:
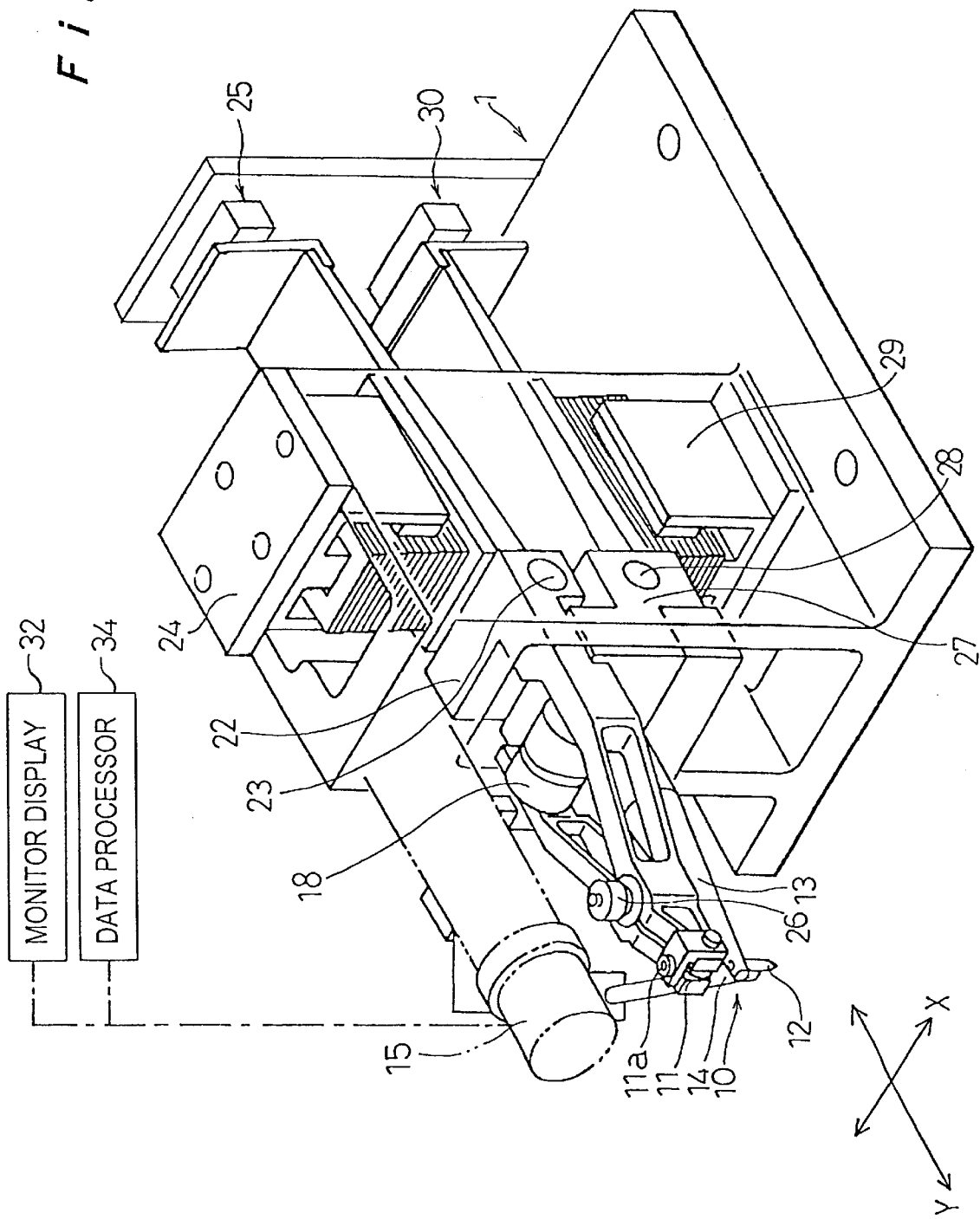
FIG. 1 is a perspective view showing a primary arrangement of a bonding head in a bump bonder according to one embodiment of the present invention.
Figure 2:
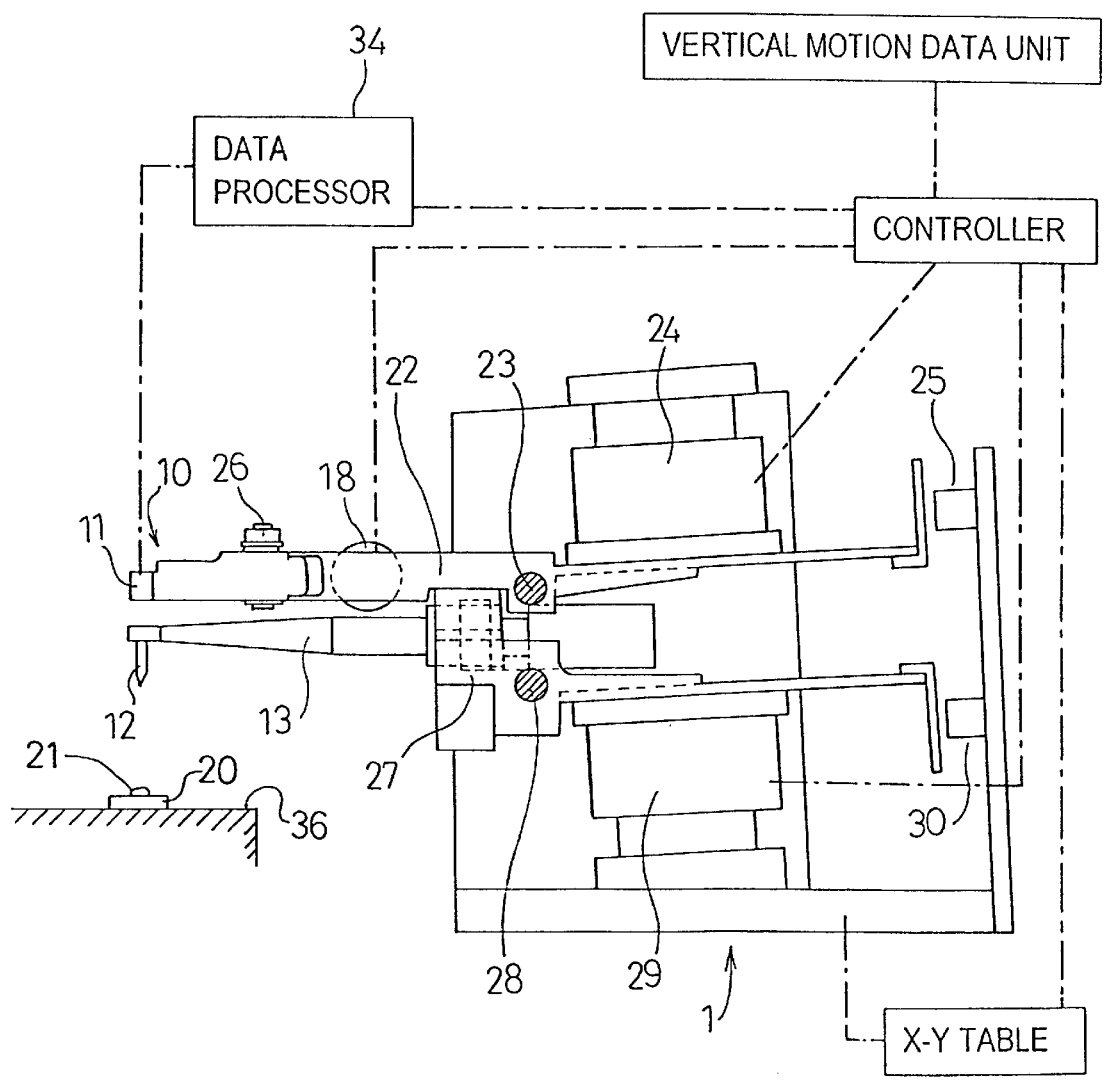
FIG. 2 is a side view showing the primary arrangement of the bonding head of the embodiment.

Referring to FIGS. 1 and 2, the bonding head denoted by reference numeral 1 is mounted on an XY table (not shown) which is movable in both X and Y directions for positioning the head 1. The bonding head 1 is located behind a bonding stage 36 which includes a heating means for ultrasonic thermal compression bonding.

A bonding mechanism 10 is provided for bonding an object or an IC chip 20 placed on the bonding stage 36, and a length of wire 4 is supplied from a wire reel (not shown) to the bonding mechanism 10. The bonding mechanism 10 comprises a damper 11 for holding the wire 4, a capillary 12 through which the wire 4 is passed at its distal end, a horn 13 for applying ultrasonic vibration to a ball 5 of the wire 4 via the capillary 12, and a torch 14 for producing electric discharge. A monitor camera 15 is mounted above for visually monitoring the bonding action and its image output is displayed on a monitor display 32 and transmitted as a monitor signal to a data processor 34 for data processing.

The damper 11 is mounted to the front of an upper swing member 22 which is supported by a horizontal pivot 23 for upward and downward swing motions. A damper vertical motion electromagnetic driver 24 is provided just behind the horizontal pivot 23 and a damper position detector 25 is provided at the rear end of the upper swing member 22. Also provided are a vertical pivot 26 which supports a middle portion of the damper 11 for opening and closing actions, and an open/close electromagnetic driver 18 mounted behind the damper 11. The horn 13 is mounted to the front end of a lower swing member 27 which is supported by a horizontal pivot 28 for upward and downward swing motions. A horn vertical motion electromagnetic driver 29 is provided just behind the horizontal pivot 28 and a horn position detector 30 is provided at the rear end of the lower swing member 27.

The bonding operation with the above described arrangement is now explained referring to FIG. 3. In the initial state, the damper 11 and the capillary 12 are positioned at a predetermined height and are spaced by a certain distance A from each other, and the wire 4 is protruded from the distal end of the capillary 12 by a given length. In this state, each time the bonding head 1 is moved to a location which is opposite to a target electrode 19 on the IC chip 20, the distal end of the wire 4 is melted by a spark current from the torch 14 so that a ball 5 such as shown in FIG. 3(a) is formed. The positional relationship between the wire 4 and the target electrode 19 opposite to each other is visually monitored by the monitor camera 15 and thus can be controlled precisely.

Next, the damper 11 is opened, after which the clamper vertical motion electromagnetic driver 24 and the horn vertical motion electromagnetic driver 29 are activated to swing the upper swing member 22 and the lower swing member 27 respectively, so as to bring the clamper 11 and the capillary 12 down towards the IC chip 20 placed on the bonding stage 36. In particular, the clamper 11 is lowered by a shorter distance which is equivalent to the length D of the wire 4 extended from the distal end of the capillary 12 than the capillary 12, so that the clamper 11 and the capillary 12 will be spaced by the distance (A+D) at the lowermost end. After descending to the lowermost end, the capillary 12 compresses the ball 5 of the wire 4 against the electrode 19 of the IC chip 20 as shown in FIG. 3(b) and ultrasonic vibration is applied via the capillary 12 by the horn 13, as a result of which the ball 5 and the electrode 19 are joined to each other through thermal compression and ultrasonic vibration. The compression force may preferably be set from 30 to 50 g and the ultrasonic vibration, which is applied in a horizontal direction, may be 0.5 micrometer in amplitude and 60 to 70 kHz in frequency (most preferably, 63.5 kHz).

During the bonding operation, the open/close electromagnetic driver 18 is activated to close the clamper 11 for securely holding the wire 4. After the bonding is completed, the clamper vertical motion electromagnetic driver 24 and the horn vertical motion electromagnetic driver 29 are activated to lift up the clamper 11 and the capillary 12. In an early stage of this ascending step, the wire 4 is separated at a boundary portion of heat effect as shown in FIG. 3(c), hence producing on the electrode 19 a bump 21 of about 60 micrometers high which consists of a ball portion 21a and a wire portion 21b extending 30 to 40 micrometers long. When the clamper 11 and the capillary 12 are lifted up after that, the lowermost end of the wire 4 is drawn out downwardly from the distal end of the capillary 12 as shown in FIG. 3(d) due to a difference in the amount of movement between the clamper 11 and the capillary 12. As the damper 11 and the capillary 12 are returned to their initial levels shown in FIG. 3(a), the difference D in the amount of movement between the two permits a given length of the wire 4 to protrude from the lower end of the capillary 12.

The bump bonder of the present invention further includes a vertical motion data unit (FIG. 2) for saving various kinds of data for controlling the upward and downward movements of the clamper 11 and the horn 13. More specifically, the amount of feeding the wire 4 may be preliminarily determined according to a desired form of the bump, types of wire or capillary, or to any other data which are saved in the data unit, based on which the respective upward and downward movements of the damper 11 and the horn 13 may be controlled.

During a cycle of the above bump forming operation, the step of lifting up the capillary by a certain distance before closing the clamper so as to draw out the wire 4 a predetermined length from the distal end of the capillary, which is included in the conventional method, is omitted, and the duration required for this step which is 0.02 second is thus eliminated, decreasing the whole duration of one cycle of bump forming operation to 0.08 second. Accordingly, the bump forming duration can be reduced by 20% only by providing respective swing members 22 and 27 and vertical motion electromagnetic drivers 24 and 29 for the damper 11 and the horn 13, whereby a remarkable improvement in productivity can be achieved.

INDUSTRIAL APPLICABILITY

As set forth above, according to the present invention, the cycle of forming a bump is decreased. The invention is thus useful in the wire bonding technology where bumps for electric connection are formed on electrodes of an IC chip.

What is claimed is:

1. A method of forming a bump comprising:

a first step of protruding a distal end of a wire (4) from a lower end of a capillary (12) by a predetermined length and forming a ball (5) from the protruded portion of the wire (4);

a second step of opening a damper (11) which securely holds the wire (4) above the capillary (12) and bringing down the capillary (12) as well as the camper (11), in which an amount of movement of the damper (11) is smaller than that of the capillary (12) by such an amount as to be equivalent to said predetermined length of the wire (4) being protruded from the lower end of the capillary (12) before forming the ball (5) in the first step;

a third step of forming a bump (21) from the ball (5) by bonding; and a fourth step of separating the wire (4) from the bump (21) by closing the damper (11) and lifting up the damper (11) and the capillary (21) to an initial position of the first step as well as causing a distal end of the wire (4) to protrude from the lower end of the capillary (12) by said predetermined length.

2. The method of forming a bump according to claim 1, wherein upward and downward movements of the damper (11) and the capillary (12) are controlled based on a predetermined amount of feeding the wire (4) which is preliminarily set according to a desired form of the bump (21) or to types of the wire (4) or the capillary (12).

* * * * *